United States Patent
Chang et al.

(10) Patent No.: US 9,099,439 B2
(45) Date of Patent: Aug. 4, 2015

(54) SEMICONDUCTOR DEVICE WITH SILICIDE CAP

(71) Applicant: Taiwan Semiconductor Manufacturing CO., LTD., Hsinchu (TW)

(72) Inventors: Chih-Fu Chang, Pingtung County (TW); Jen-Pan Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/079,950

(22) Filed: Nov. 14, 2013

(65) Prior Publication Data

US 2015/0129976 A1    May 14, 2015

(51) Int. Cl.
| | |
|---|---|
| *H01L 21/44* | (2006.01) |
| *H01L 29/45* | (2006.01) |
| *H01L 21/3205* | (2006.01) |
| *H01L 21/321* | (2006.01) |
| *H01L 21/3213* | (2006.01) |
| *H01L 21/324* | (2006.01) |
| *H01L 21/02* | (2006.01) |

(52) U.S. Cl.
CPC .......... *H01L 29/456* (2013.01); *H01L 21/0262* (2013.01); *H01L 21/02532* (2013.01); *H01L 21/324* (2013.01); *H01L 21/3212* (2013.01); *H01L 21/32051* (2013.01); *H01L 21/32053* (2013.01); *H01L 21/32133* (2013.01)

(58) Field of Classification Search
CPC .................... H01L 21/76849; H01L 29/41791
USPC .......................... 438/607, 605; 257/383, 384
See application file for complete search history.

(56) References Cited

U.S. PATENT DOCUMENTS

| | | | |
|---|---|---|---|
| 2001/0003056 A1* | 6/2001 | Hashimoto et al. | 438/592 |
| 2003/0060059 A1* | 3/2003 | Summerfelt | 438/775 |
| 2005/0035460 A1* | 2/2005 | Tseng | 257/760 |
| 2013/0181264 A1* | 7/2013 | Liao et al. | 257/288 |
| 2014/0191298 A1* | 7/2014 | Chen et al. | 257/288 |
| 2014/0199837 A1* | 7/2014 | Hung et al. | 438/675 |

* cited by examiner

*Primary Examiner* — Caridad Everhart
(74) *Attorney, Agent, or Firm* — Servilla Whitney LLC

(57) ABSTRACT

A semiconductor device includes a substrate, an epi-layer, an etch stop layer, an interlayer dielectric (ILD) layer, a silicide layer cap and a contact plug. The substrate has a first portion and a second portion neighboring to the first portion. The etch stop layer is disposed on the second portion. The ILD layer is disposed on the etch stop layer. The silicide cap is disposed on the epi-layer. The contact plug is disposed on the silicide cap and surrounded by the ILD layer.

19 Claims, 16 Drawing Sheets

SEMICONDUCTOR DEVICE WITH SILICIDE CAP

FIELD

The present disclosure relates to a semiconductor device, and more particularly, to a semiconductor device with a silicide cap.

BACKGROUND

As integration of elements in integrated circuits (IC) increases, line widths and geometries for semiconductor devices are reduced. Accordingly, resistance of a gate and source/drain regions of a MOS transistor made by conventional techniques is relatively high. To reduce the resistance, a metal silicide layer is formed on the gate or the source/drain regions by a self-aligned silicide (salicide) process, and then an interlayer dielectric (ILD) layer is formed on the metal silicide layer for isolation. Thereafter, the ILD layer is etched using an etchant to form a trench to expose a metal silicide layer, such that a contact plug may be formed on the metal silicide layer and extends to a surface of the ILD layer through the trench. At operation of forming the trench, the metal silicide layer is often damaged by the etchant. In some conditions, the metal silicide layer is even penetrated, and the subsequently formed contact plug is electrically connected to the gate or the source/drain regions directly, and thus the effect of the metal silicide layer reducing the resistance of the gate and source/drain regions of the MOS transistor is decreased or fails. Therefore, the purpose of reducing the resistance using the metal silicide layer cannot be fully achieved.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1A:
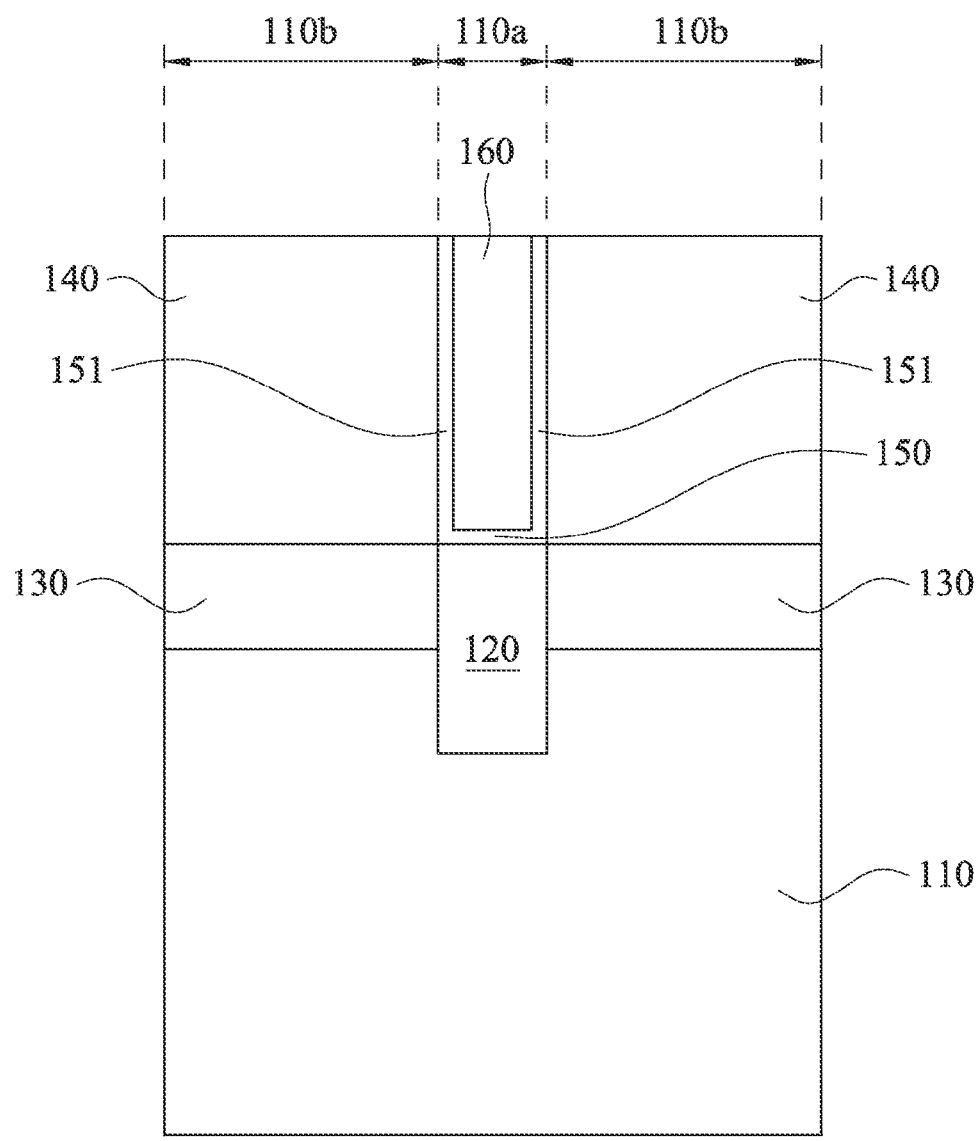
FIG. 1A and FIG. 1B are schematic cross-sectional views showing a semiconductor device for various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

Embodiments of the present disclosure provide silicon cap designs for semiconductor devices (such as image sensors or logic devices) to reduce a resistance between a contact plug and an epi-layer without using a salicide process. In the formation process of the semiconductor substrate, an epi-layer and an etch stop layer are respectively formed on a the first portion and a second portion of a substrate. An ILD layer is formed on the epi-layer and the etch stop layer, and then the ILD layer on the first portion is etched to form a contact opening for exposing the epi-layer. A silicide cap on the epi-layer is formed through the contact opening, and the contact opening is filled with a contact plug. Thus, the silicide cap is formed after the etching operation, thereby preventing the silicide cap from being damage by the etchant.

According to various embodiments of the present disclosure, the silicide cap is formed by forming a silicon layer on the ILD layer and the epi-layer, and is conformal to the contact opening. Then, the silicon layer is annealed to form a silicide cap and a silicide layer. The silicon layer on the ILD layer and the epi-layer, and conformal to the contact opening is formed using a chemical vapor deposition (CVD) process, a physical vapor deposition (PVD) process or a high density plasma (HDP) process, etc. In some embodiments, the silicide layer conformal to the contact opening is etched for decreasing an aspect ratio of the contact opening.

Figure 1B:
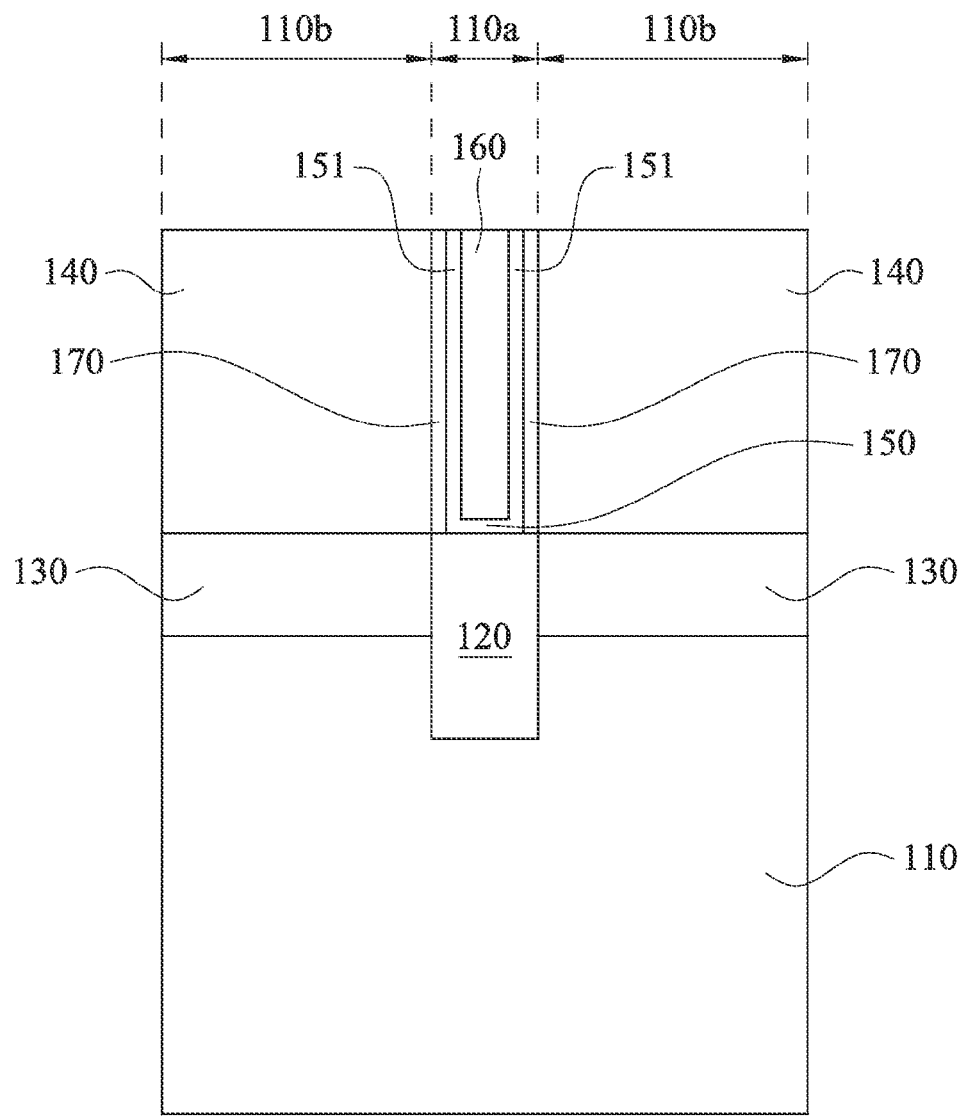

FIG. 1A and FIG. 1B are schematic cross-sectional views showing a semiconductor device for various embodiments. As shown in FIG. 1A and FIG. 1B, the semiconductor device 100 of the present disclosure includes a substrate 110, an epi-layer 120, an etch stop layer 130, an ILD layer 140, a silicide cap 150 and a contact plug 160. The substrate 110 has a first portion 110a and a second portion 110b neighboring to the first portion 110a. In some embodiments, the substrate 110 is a semiconductor substrate formed from such as silicon. Other commonly used materials, such as carbon, germanium, silicon-germanium, gallium, arsenic, nitrogen, indium, phosphorus, and/or the like, may also be included in the semiconductor substrate. The substrate 110 may be formed from a single-crystalline semiconductor material or compound semiconductor materials, and may be a bulk substrate or a semiconductor-on-insulator (SOI) substrate.

The epi-layer 120 formed from such as silicon nitride or silicon oxy-nitride, is disposed on the first portion 110a of the substrate 110. In some embodiments, the epi-layer 120 may be used as a source/drain region or a gate. In alternative embodiments, the epi-layer 120 is an undoped epitaxial layer, such as a pure Si epitaxial layer; or a doped epitaxial layer, such as a boron-doped, phosphor-doped, arsenic-doped or carbon-doped Si epitaxial layer. In some embodiments, the epi-layer 120 may be formed using a selective expitaxial growth (SEG) operation.

The etch stop layer 130 is disposed on the second portion 110b of the substrate 110 to prevent problems caused by contact misalignment. In some embodiments, the etch stop layer 130 may be formed from commonly used materials including, but not limited to, $SiN_x$, $SiO_x$, SiON, SiC, SiCN, BN, SiBN, SiCBN, and combinations thereof. In alternative embodiments, the etch stop layer 130 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used.

The ILD layer 140 is disposed on the etch stop layer 130 for isolation. In some embodiments, the ILD layer 140 may be formed from commonly used materials including, but not limited to, $SiN_x$, $SiO_x$, SiON, SiC, SiBN, SiCBN, and combinations thereof. In some embodiments, the ILD layer 140 is formed using HDP, although other methods such as SACVD, LPCVD, ALD, PEALD, PECVD, MLD, PICVD, spin-on, and the like may also be used.

The silicide cap 150 is disposed on the epi-layer 120 for decreasing resistance between the contact plug 160 and the epi-layer 120. In some embodiments, the silicide cap 150 is formed from titanium silicide, nickel silicide, cobalt silicide, platinum silicide, palladium silicide, tungsten silicide, tantalum silicide or erbium silicide. In alternative embodiments, the silicide cap 150 is formed by the operation of forming a silicon layer on the epi-layer 120 and then annealing the silicon layer. The operation of forming the silicon layer on the epi-layer 120 may be performed using a chemical vapor deposition (CVD) process, a physical vapor deposition (PVD) process or a high density plasma (HDP) process, etc. When the aforementioned deposition process and the annealing operation are performed, a silicide layer 151 between the contact plug 160 and the ILD layer 140 is also formed. In some embodiments, the silicide layer 151 between the contact plug 160 and the ILD layer 140 may be removed by an etching operation, such that the subsequent contact plug 160 is easily disposed on the silicide cap 150 and surrounded by the ILD layer 140.

The contact plug 160 is disposed on the silicide cap 150 and surrounded by the ILD layer 140, such that the contact plug 160 is electrically connected to the epi-layer 120 via the silicide cap 150. In some embodiments, the contact plug 160 includes aluminum (Al), tungsten (W), or copper (Cu), etc. In alternative embodiments, the contact plug 160 is formed using a CVD process.

In some embodiments, a liner 170 formed from such as silicon nitride, silicon oxy-nitride, silicon carbide or silicon oxy-carbide is disposed between the contact plug 160 and the ILD layer 140 for improving interface flatness between the contact plug 160 and the ILD layer 140, as shown in FIG. 1B. In some embodiments, the aforementioned silicide layer 151 may be formed between the contact plug 160 and the liner 170.

Figure 2A:
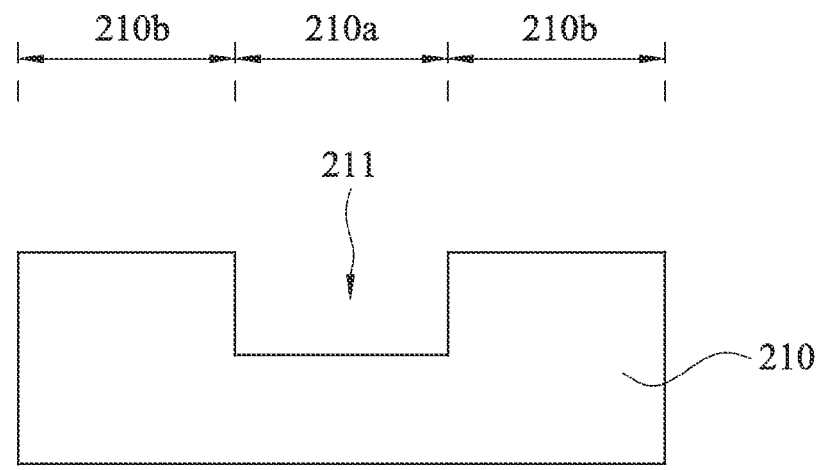
FIG. 2A-FIG. 2G are schematic cross-sectional views of intermediate stages showing a method for fabricating a semiconductor device in accordance with some embodiments.
Figure 2B:
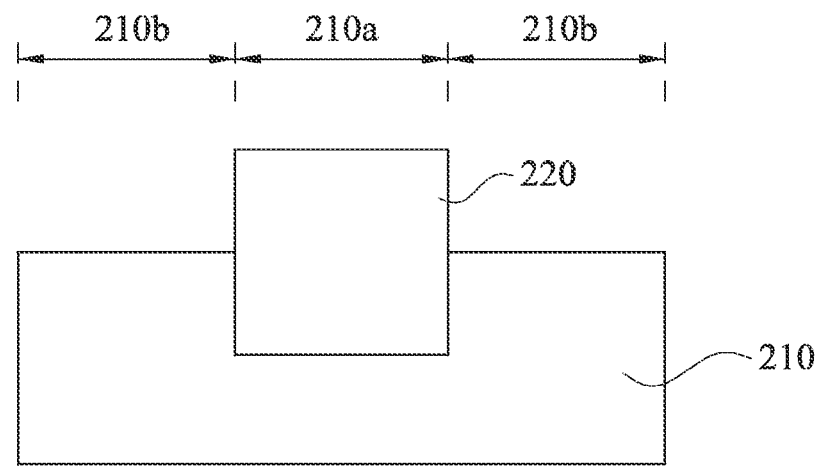

FIG. 2A-FIG. 2G are schematic cross-sectional views of intermediate stages showing a method for fabricating a semiconductor device in accordance with some embodiments. As shown in FIG. 2A, a substrate 210 is provided. The substrate 210 has a first portion 210a and a second portion 210b neighboring to the first portion 210a. In some embodiments, the first portion 210a is etched to form a trench 211, such that a subsequent epi-layer 220 as shown in FIG. 2B may be formed in the trench 201.

As shown in FIG. 2B, the epi-layer 220 is formed on the first portion 210a, where the epi-layer 220 may be defined as a source/drain region or a gate. In some embodiments, the epi-layer 220 is an undoped epitaxial layer, such as a pure Si epitaxial layer; or a doped epitaxial layer, such as a boron-doped, phosphor-doped, arsenic-doped or carbon-doped Si epitaxial layer. In alternative embodiments, the epi-layer 220 may be formed using a selective expitaxial growth (SEG) operation.

Figure 2C:
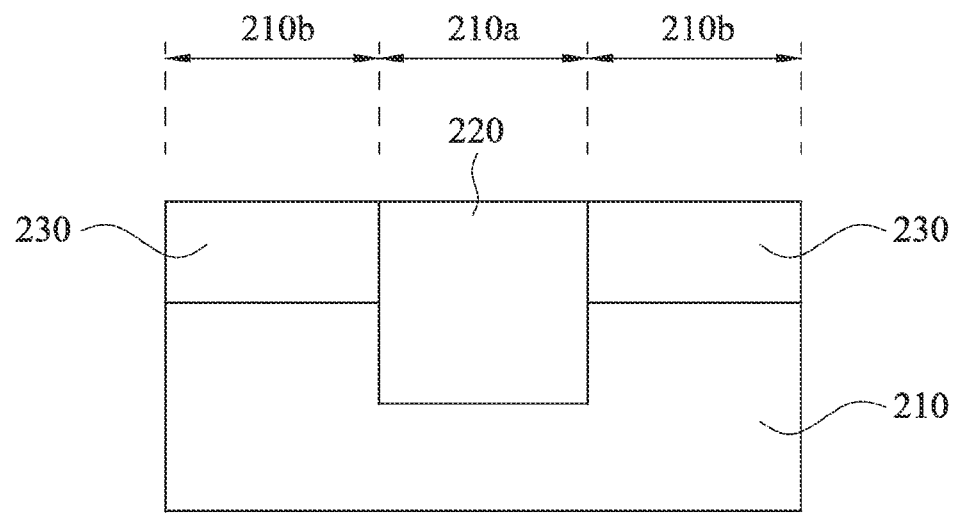

As shown in FIG. 2C, an etch stop layer 230 is formed on the second portion 210b. In some embodiments, the etch stop layer 230 may be formed from commonly used materials including, but not limited to, $SiN_x$, $SiO_x$, SiON, SiC, SiCN, BN, SiBN, SiCBN, and combinations thereof. In alternative embodiments, the etch stop layer 230 is formed using plasma enhanced chemical vapor deposition (PECVD), although other methods such as sub atmospheric chemical vapor deposition (SACVD), low pressure chemical vapor deposition (LPCVD), atomic layer deposition (ALD), high-density plasma (HDP), plasma enhanced atomic layer deposition (PEALD), molecular layer deposition (MLD), plasma impulse chemical vapor deposition (PICVD), and the like can also be used.

Figure 2D:
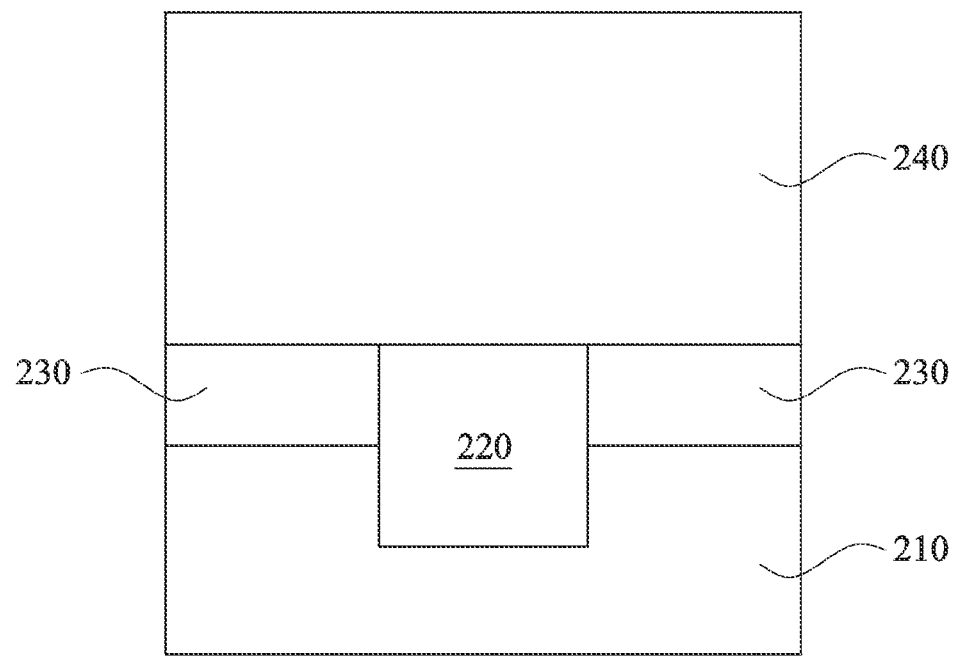

As shown in FIG. 2D, an ILD layer 240 is formed on the etch stop layer 230 and the epi-layer 220. In some embodiments, the ILD layer 240 may be formed from commonly used materials including, but not limited to, $SiN_x$, $SiO_x$, SiON, SiC, SiBN, SiCBN, and combinations thereof. In some embodiments, the ILD layer 240 is formed using HDP, although other methods such as SACVD, LPCVD, ALD, PEALD, PECVD, MLD, PICVD, spin-on, and the like may also be used.

Figure 2E:
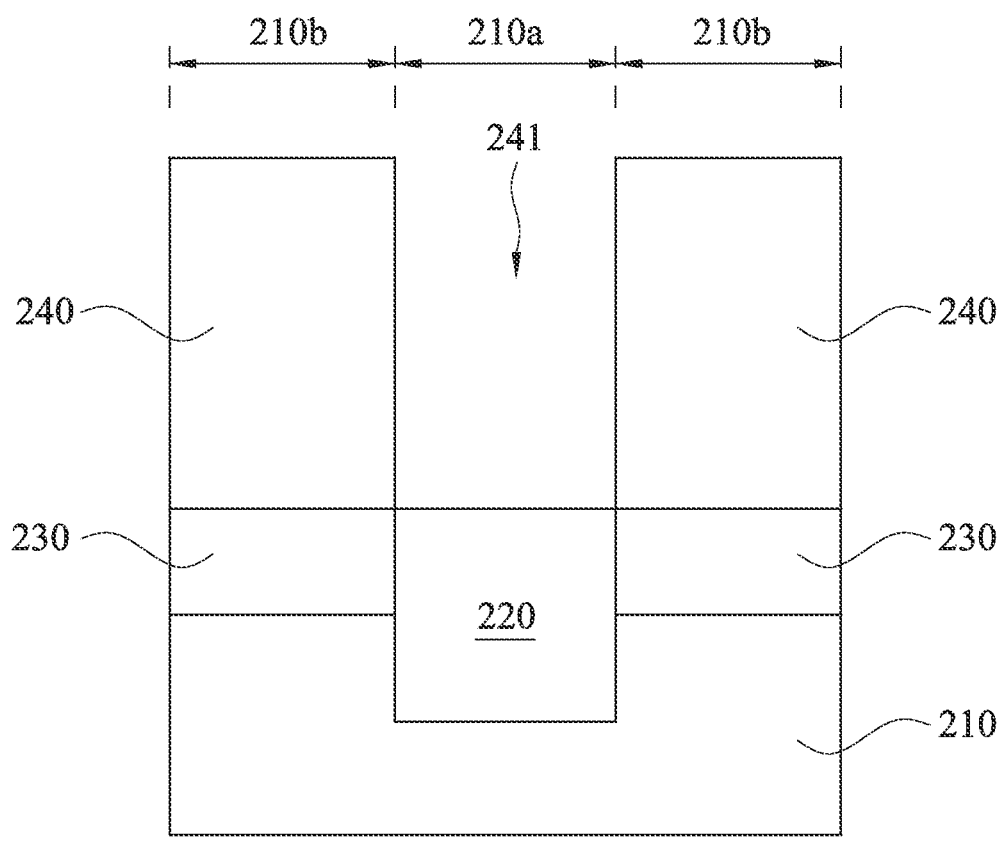

As shown in FIG. 2E, the ILD layer 240 on the first portion 210a of the substrate 210 is etched to form a contact opening 241 for exposing the epi-layer 220. The ILD layer 240 may be etched using a dry etching process or a wet etching process.

Figure 2F:
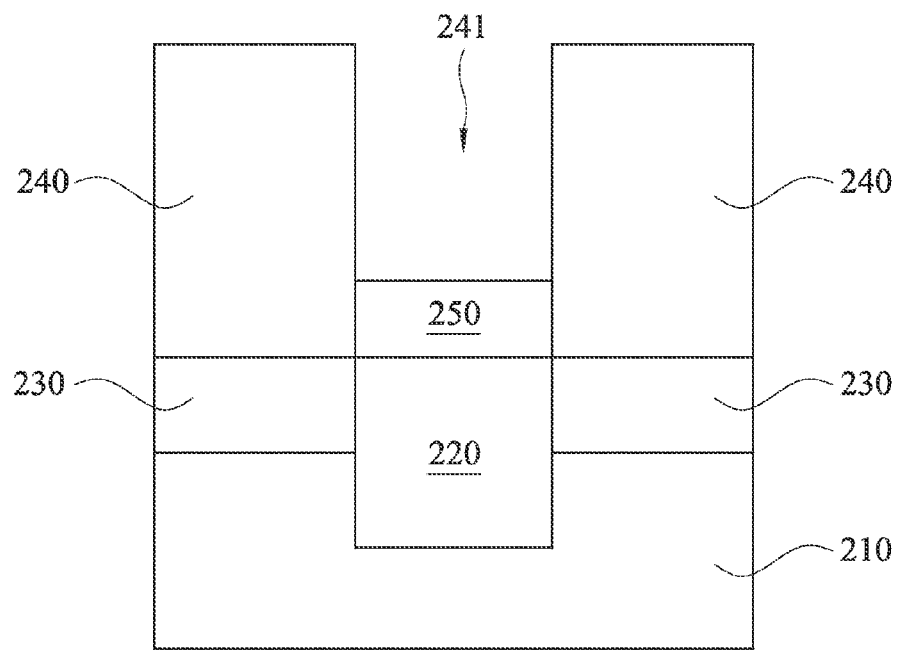
Figure 3A:
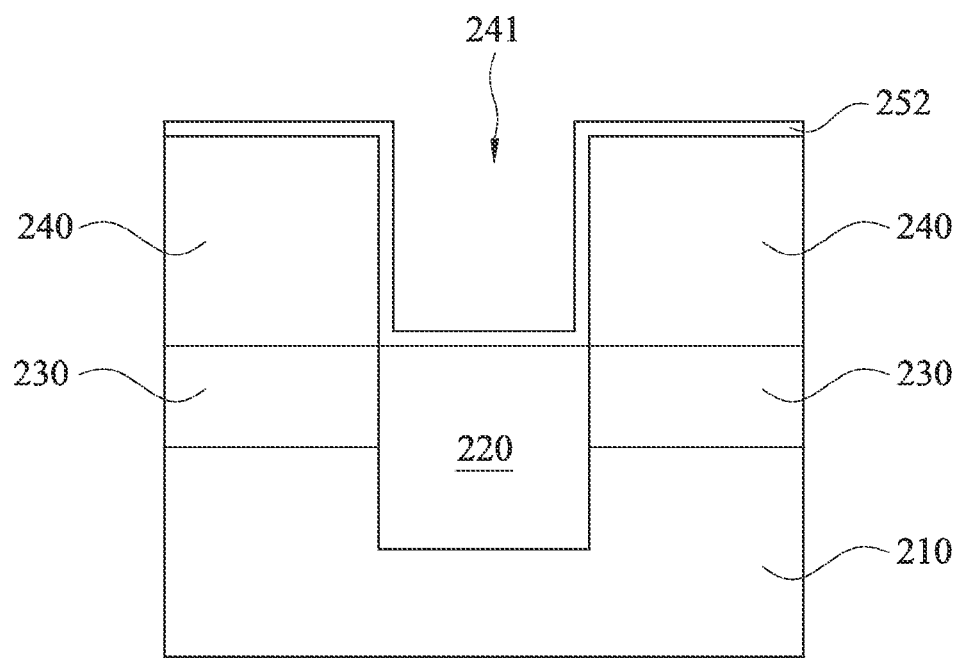
FIG. 3A-FIG. 3C are schematic cross-sectional views of intermediate stages showing an operation for forming a silicide cap in accordance with some embodiments.
Figure 3B:
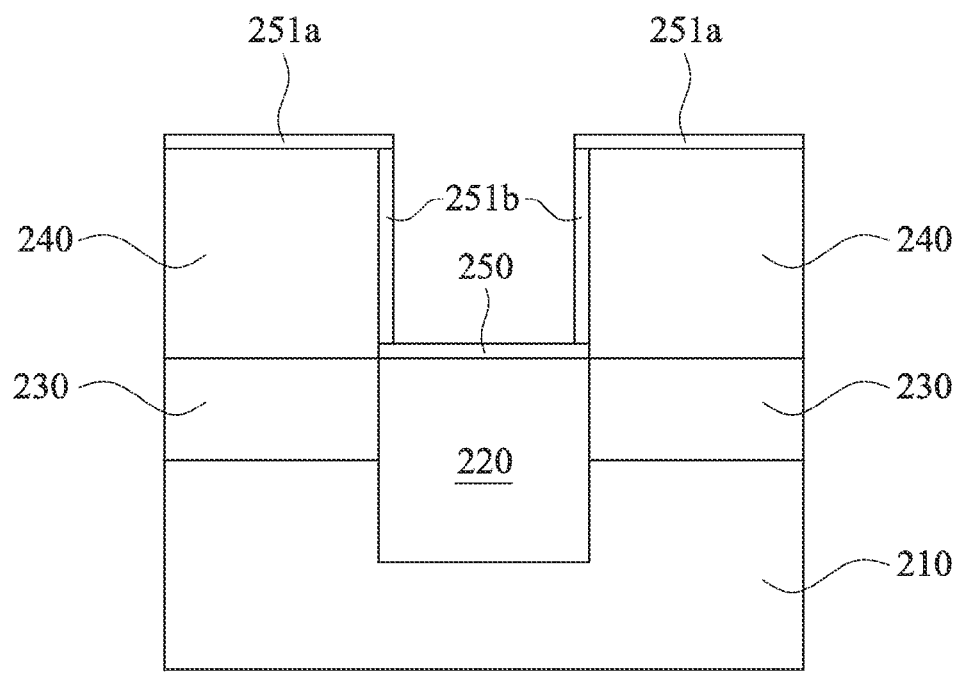
Figure 3C:
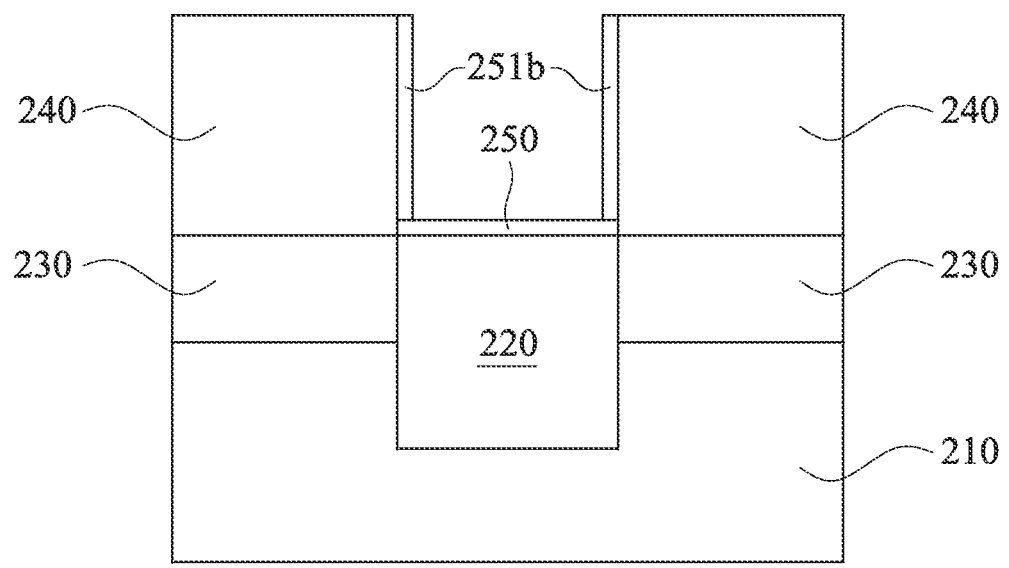

As shown in FIG. 2F, a silicide cap 250 is formed on the epi-layer 220 through the contact opening 241. Referring to FIG. 2F together with FIG. 3A to 3C, FIG. 3A-FIG. 3C are schematic cross-sectional views of intermediate stages showing an operation for forming the silicide cap 250 in accordance with some embodiments. As shown in FIG. 3A, the operation of forming the silicide cap 250 is first performed to form a silicon layer 252 conformal to the contact opening 241, on the ILD layer 220 and on the epi-layer 240. The silicon layer 252 that is disposed on the ILD layer 220 and the epi-layer 240, and is conformal to the contact opening 241 may be formed by a CVD process, a PVD process or a HDP process, etc. In some embodiments, the silicon layer 252 formed by the PVD process or the HDP process may have a thinner thickness than that by the CVD process. Then, the silicon layer 252 is annealed to form the silicide cap 250 on the epi-layer 220, a silicide layer 251a on an the ILD layer 240 and a silicide layer 251b conformal to the contact opening 241, as shown in FIG. 3B. In some embodiments, the silicon layer 252 is annealed using a rapid thermal annealing (RTA) procedure, a laser annealing process or a flash annealing process. After the operation of annealing the silicon layer 252, the silicide layer 251a on the ILD layer 240 is removed. In some embodiments, the silicide layer 251a on the ILD layer 240 is removed using a chemical mechanical polishing (CMP) process, as shown in FIG. 3C.

Figure 2G:
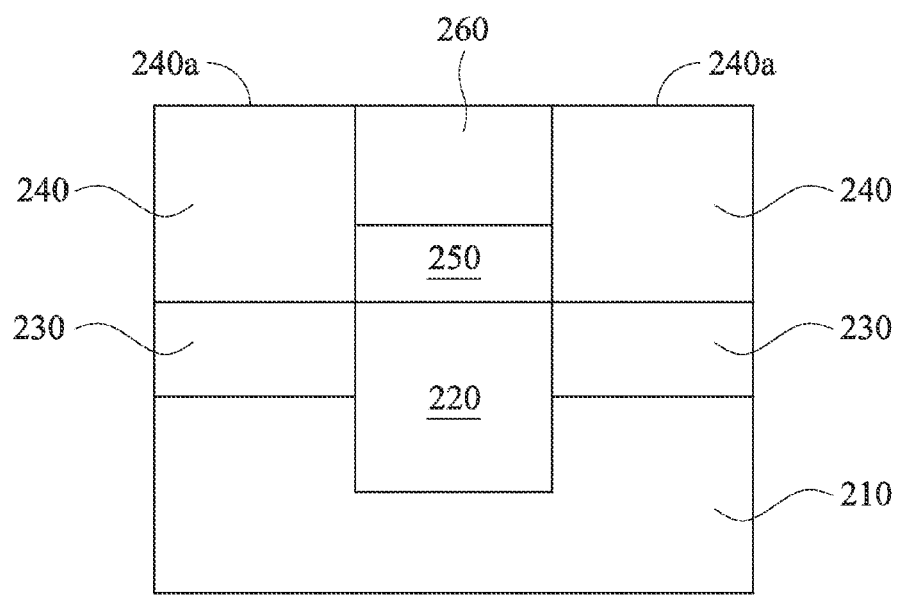

As shown in FIG. 2G, the contact opening 241 as shown in FIG. 2F is filled with a contact plug 260 formed including such as Al, W or Cu, etc. In some embodiments, the contact opening 241 is filled with the contact plug 260 using a deposition operation to deposit the material of Al, W or Cu uniformly in the contact opening 241 and on the surface 240a of the ILD layer 240, and then the remaining material on the ILD layer 240 may be removed using a CMP process. In alternative embodiments, the aforementioned operation of removing the silicide layer 251a on the ILD layer 240 may be omitted if the operation of removing the remaining material on the ILD layer 240 is performed. In some embodiments, the contact plug 260 may include a glue layer (not shown) formed from such as TiN, thereby enhancing the adhesion of the contact plug 260 itself in the contact opening 241.

In some embodiments, the aforementioned silicide layer 251b conformal to the contact opening 241 may be etched before the operation of filling the contact opening 241, thereby decreasing an aspect ratio of the contact opening 241. Thus, the contact opening 241 is more easily filled with the contact plug 260.

FIG. 4A-FIG. 4H are schematic cross-sectional views of intermediate stages showing a method for fabricating a semiconductor device in accordance with certain embodiments. The processing methods used in FIG. 4A-FIG. 4E are similar to those in FIG. 2A-FIG. 2E, and are not repeated again.

As shown in FIG. 4A-4E, a substrate 410 is provided. The substrate 410 has a first portion 410a and a second portion 410b neighboring to the first portion 410a. An epi-layer 420 is formed on the first portion 410a. An etch stop layer 430 is formed on the second portion 410b. An ILD layer 440 is formed on the etch stop layer 430 and the epi-layer 420. The ILD layer 440 on the first portion 410a of the substrate 410 is etched to form a contact opening 441 for exposing the epi-layer 420.

Figure 4A:
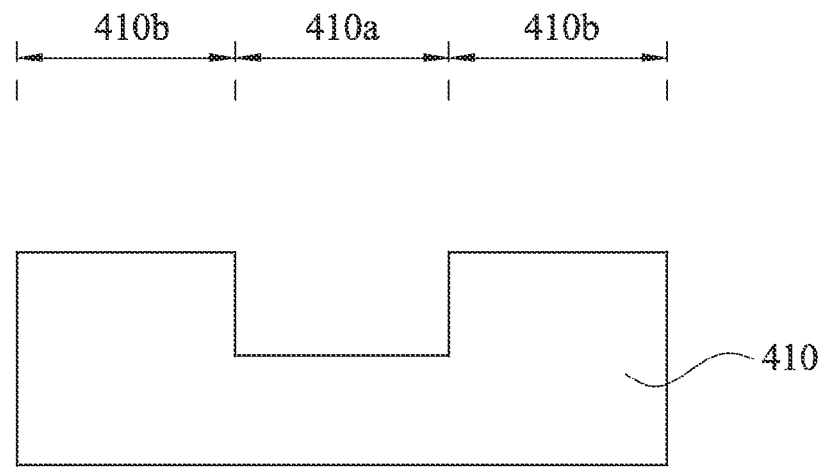
FIG. 4A-FIG. 4H are schematic cross-sectional views of intermediate stages showing a method for fabricating a semiconductor device in accordance with certain embodiments.
Figure 4B:
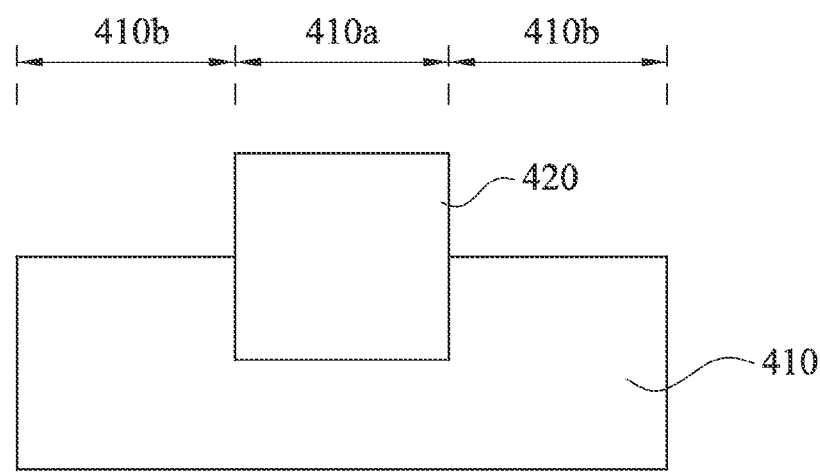
Figure 4C:
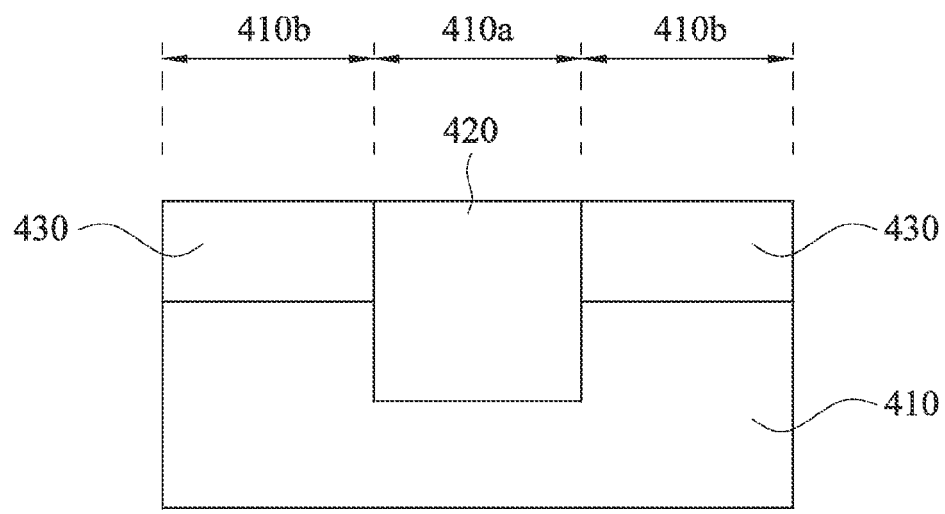
Figure 4D:
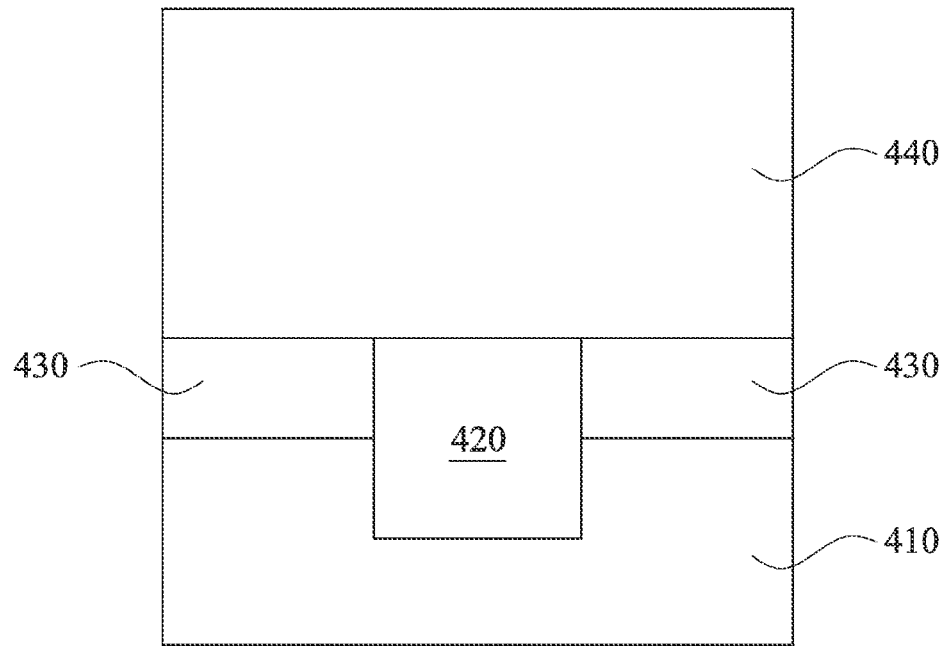
Figure 4E:
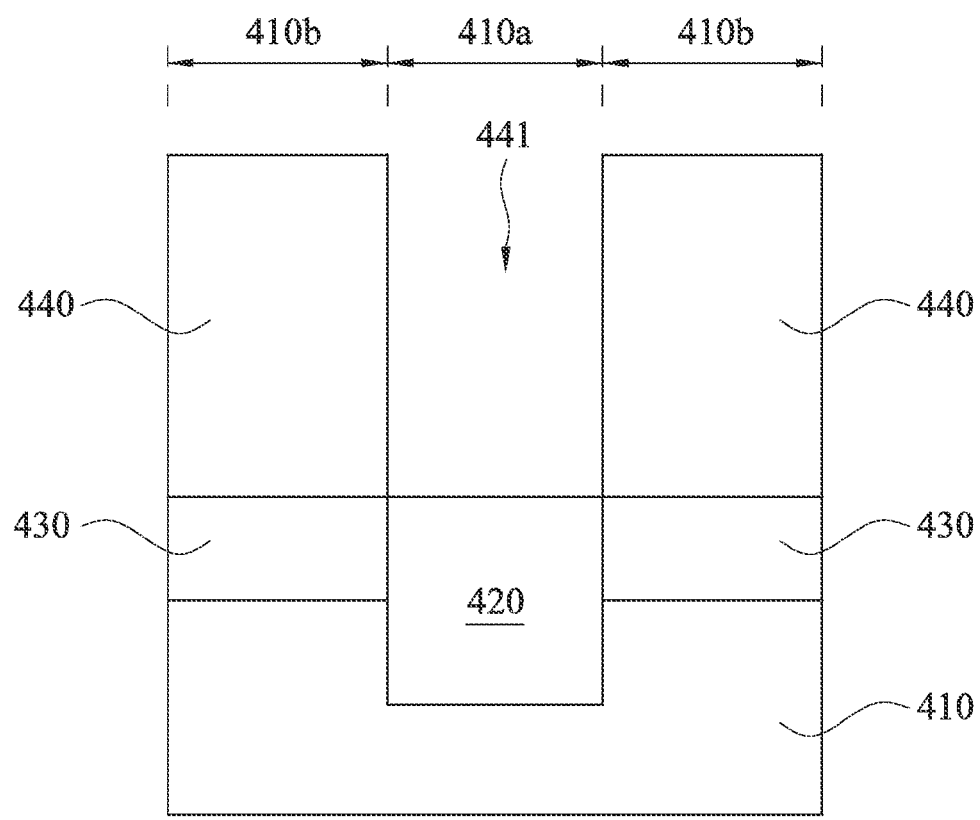
Figure 4F:
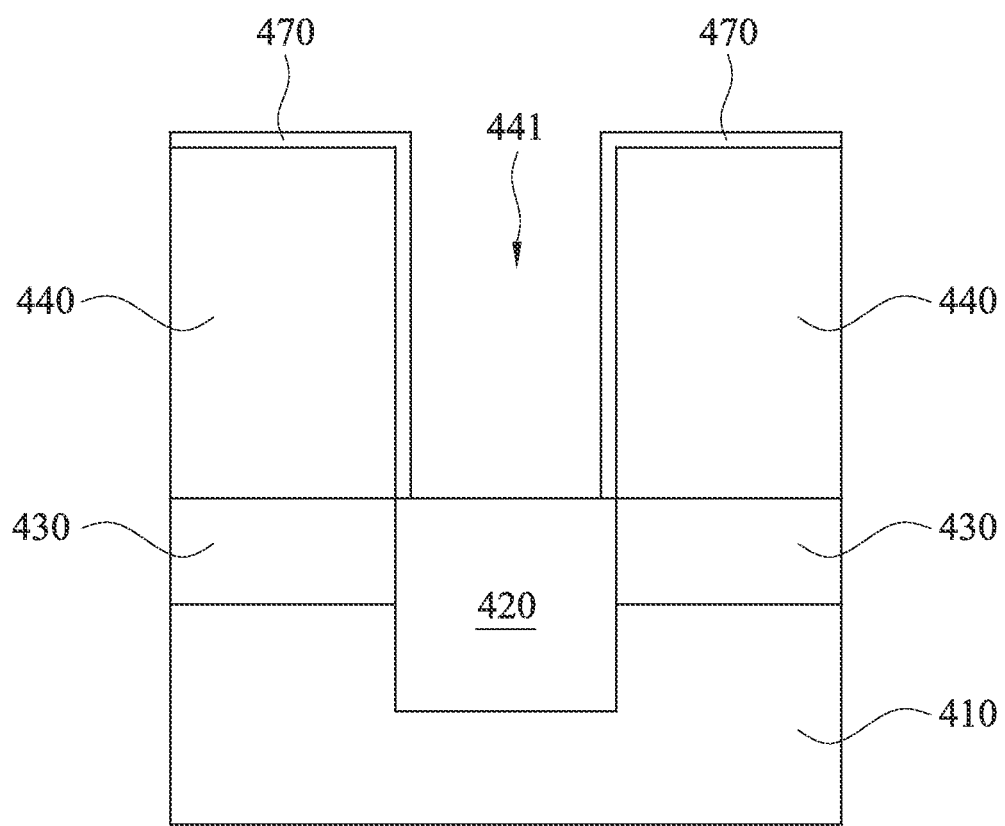

As shown in FIG. 4F, a liner 470 is formed on the ILD layer 440 and conformal to the contact opening 441. In some embodiments, the liner 440 is first formed conformal to the contact opening 441, on the epi-layer 420 and on the ILD layer 440, and then the liner 470 on the epi-layer 420 is removed using an etching operation.

Figure 4G:
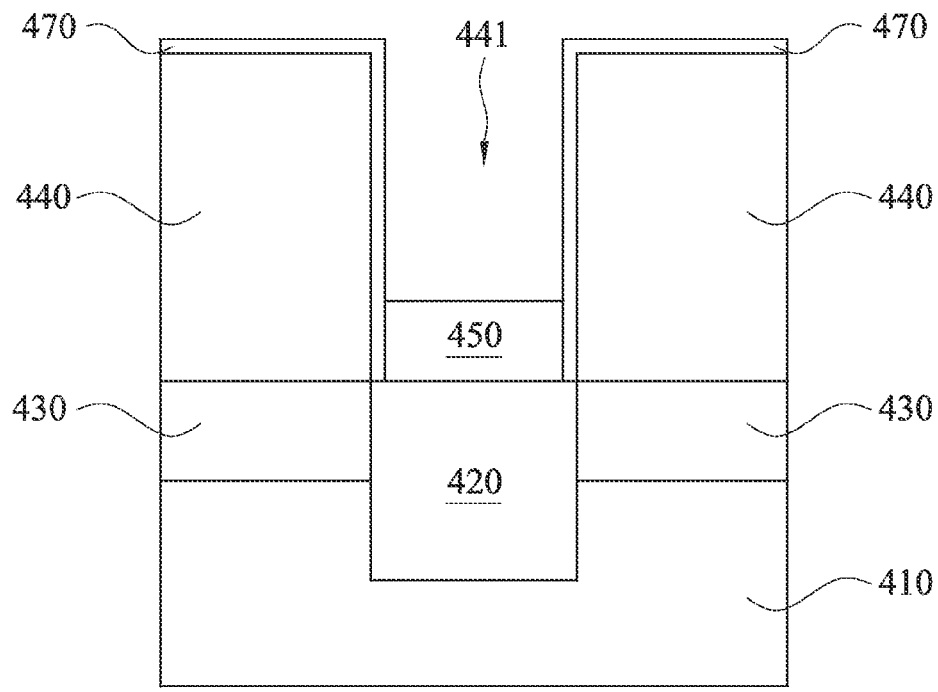
Figure 5A:
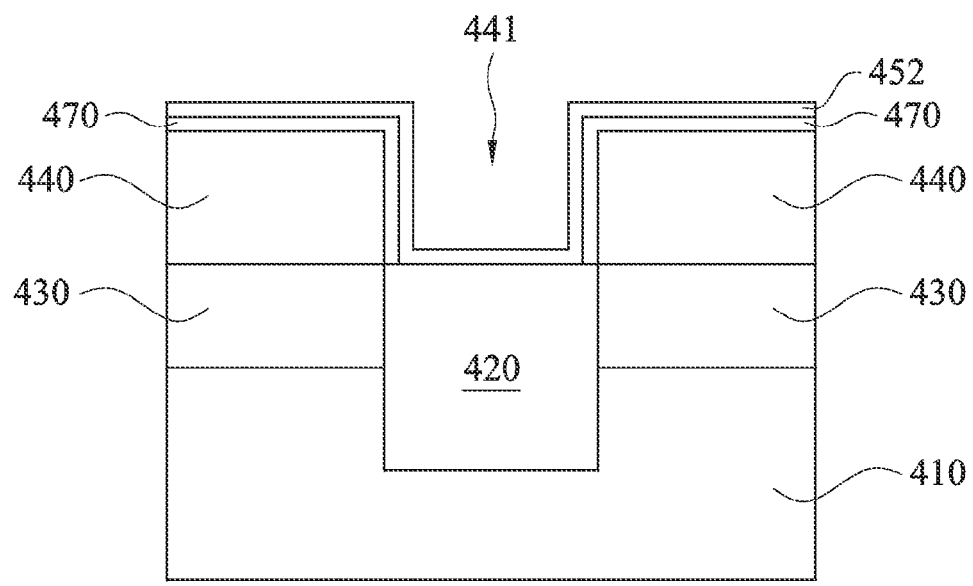
FIG. 5A-FIG. 5C are schematic cross-sectional views of intermediate stages showing an operation for forming a silicide cap in accordance with certain embodiments.
Figure 5B:
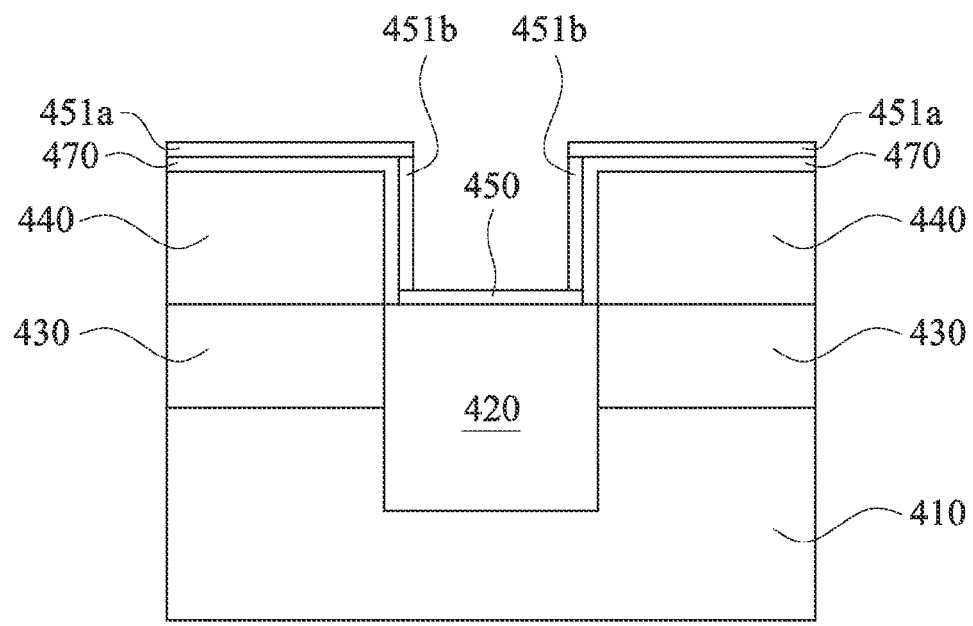
Figure 5C:
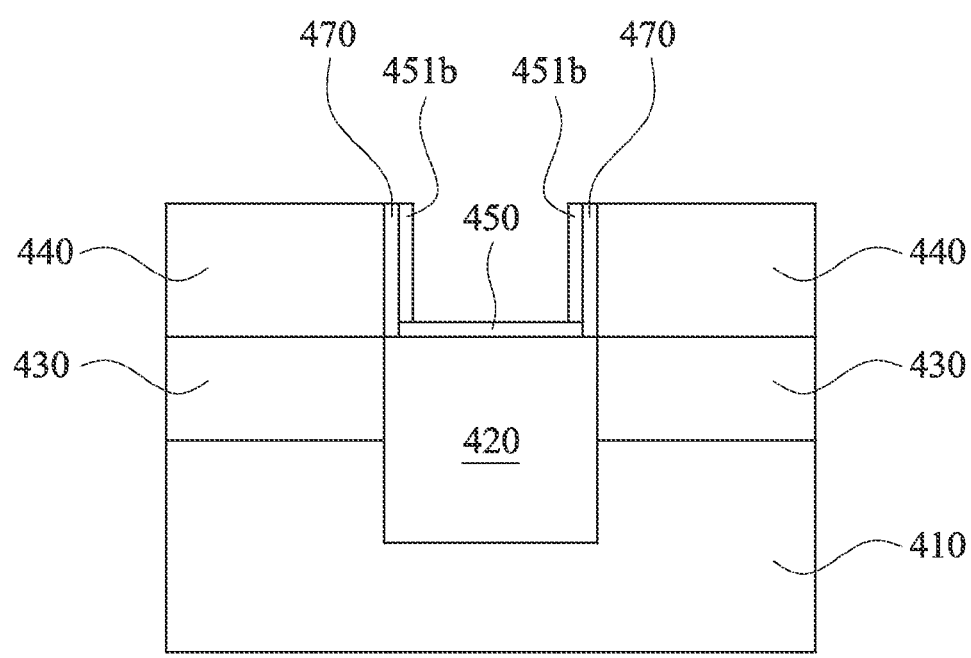

As shown in FIG. 4G, a silicide cap 450 is formed on the epi-layer 420 through the contact opening 441. Referring to FIG. 4G together with FIG. 5A to 5C, FIG. 5A-FIG. 5C are schematic cross-sectional views of intermediate stages showing an operation for forming the silicide cap 450 in accordance with certain embodiments. As shown in FIG. 5A, the operation of forming the silicide cap 450 is first forming a silicon layer 452 conformal to the liner 470 and on the epi-layer 420. The silicon layer 452 conformal to the liner 470 and on the epi-layer 420 may be formed using a CVD process, a PVD process or a HDP process, etc. Then, the silicon layer 452 is annealed to form the silicide cap 450 on the epi-layer 420 and silicide layers 451a and 451b on the liner 470, as shown in FIG. 5B. In some embodiments, the silicon layer 452 is annealed using a rapid thermal annealing (RTA) procedure, a laser annealing process or a flash annealing process. After the operation of annealing the silicon layer 452 is performed, both the silicide layer 451a and the liner 470 above the ILD layer are removed using such as a CMP process, as shown in FIG. 5C.

Figure 4H:
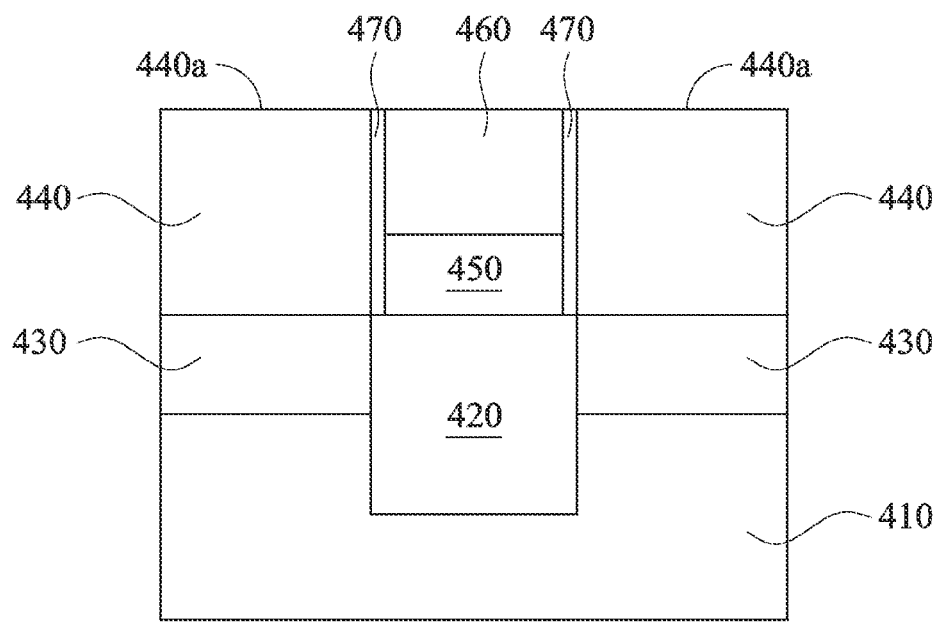

As shown in FIG. 4H, the contact opening 441 as shown in FIG. 4G is filled with a contact plug 460. In some embodiments, the contact opening 441 is filled with the contact plug 460 using a deposition operation to deposit the material of Al, W or Cu uniformly in the contact opening 441 and on the outer surface 440a of the ILD layer 440, and then the remaining material on the ILD layer 440 may be removed using a CMP process.

Figure 6:
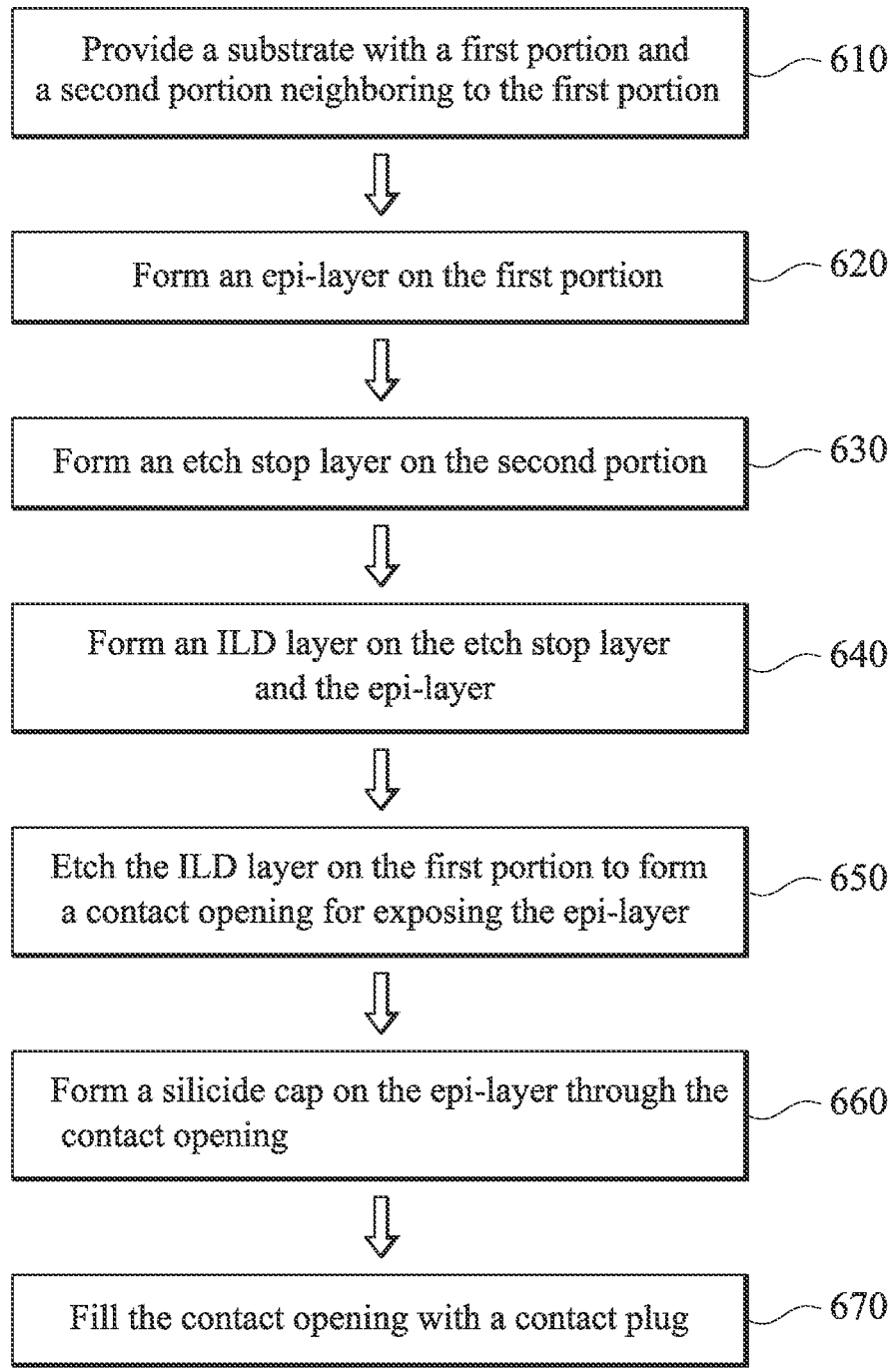
FIG. 6 is a flow chart of a method for fabricating a semiconductor device in accordance with various embodiments.

Referring to FIG. 6 with FIG. 2A-FIG. 2G, FIG. 6 is a flow chart of a method 600 for fabricating a semiconductor device in accordance with various embodiments. The method 600 begins at operation 610, where a substrate 210 with a first portion 210a and a second portion 210b neighboring to the first portion 210a is provided, as shown in FIG. 2A. At operation 620, an epi-layer 220 is formed on the first portion 210a, as shown in FIG. 2B. At operation 630, an etch stop layer 230 is formed on the second portion 210b, as shown in FIG. 2C. At operation 540, an ILD layer 240 on the etch stop layer 230 and the epi-layer 220 is formed, as shown in FIG. 2D. At operation 650, the ILD layer 240 on the first portion 210a is etched to form a contact opening 241 for exposing the epi-layer 220, as shown in FIG. 2E. At operation 660, a silicide cap 250 is formed on the epi-layer 220 through the contact opening 241, as shown in FIG. 2F. At operation 670, the contact opening 241 is filled with a contact plug 260, as shown in FIG. 2G.

In accordance with some embodiments, the present disclosure discloses a semiconductor device including a substrate, an epi-layer, an etch stop layer, an interlayer dielectric (ILD) layer, a silicide layer cap and a contact plug. The substrate has a first portion and a second portion neighboring to the first portion. The etch stop layer is disposed on the second portion. The ILD layer is disposed on the etch stop layer. The silicide cap is disposed on the epi-layer. The contact plug is disposed on the silicide cap and surrounded by the ILD layer.

In accordance with certain embodiments, the present disclosure disclosed a method for fabricating a semiconductor device. In this method, a substrate having a first portion and a second portion neighboring to the first portion is provided. An epi-layer on the first portion is formed. An etch stop layer on the second portion is formed. An ILD layer on the etch stop layer and the epi-layer is formed. The ILD layer on the first portion is etched to form a contact opening for exposing the epi-layer. A silicide cap on the epi-layer is formed through the contact opening. The contact opening is filled with a contact plug.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate with a first portion and a second portion neighboring to the first portion;
   an epi-layer disposed on the first portion;
   an etch stop layer disposed on the second portion;
   an interlayer dielectric (ILD) layer disposed on the etch stop layer,
   a silicide cap disposed on the epi-layer; and
   a contact plug disposed on the silicide cap and surrounded by the ILD layer; and
   a silicide layer between the contact plug and the ILD layer.

2. The semiconductor device of claim 1, wherein the silicide cap is formed from titanium silicide, nickel silicide, cobalt silicide, platinum silicide, palladium silicide, tungsten silicide, tantalum silicide or erbium silicide.

3. The semiconductor device of claim 1, wherein the contact plug comprises aluminum (Al), tungsten (W), or copper (Cu).

4. The semiconductor device of claim 1, wherein the epi-layer is formed from silicon or silicon-germanium.

5. The semiconductor device of claim 1, wherein the epi-layer is a source/drain region or a gate.

6. The semiconductor device of claim 1, further comprising a liner between the contact plug and the ILD layer.

7. The semiconductor device of claim 6, wherein the silicide layer is between the contact plug and the liner.

8. The semiconductor device of claim 6, wherein the liner is formed from silicon nitride, silicon oxy-nitride, silicon carbide or silicon oxy-carbide.

9. A method for fabricating a semiconductor device, comprising:
   providing a substrate with a first portion and a second portion neighboring to the first portion;
   forming an epi-layer on the first portion;
   forming an etch stop layer on the second portion;
   forming an ILD layer on the etch stop layer and the epi-layer;
   etching the ILD layer on the first portion to form a contact opening for exposing the epi-layer;
   forming a silicide cap on the epi-layer through the contact opening; and
   filling the contact opening with a contact plug.

10. The method of claim 9, wherein the operation of filling the contact opening comprises filling the contact opening with the contact plug formed from Al, W or Cu.

11. The method of claim 9, wherein the operation of forming the silicide cap comprises:
   forming a silicon layer on the ILD layer and the epi-layer, and conformal to the contact opening;
   annealing the silicon layer to form the silicide cap on the epi-layer and a silicide layer on the ILD layer and conformal to the contact opening; and
   removing the silicide layer on the ILD layer.

12. The method of claim 11, wherein the operation of forming the silicide cap comprises etching the silicide layer conformal to the contact opening.

13. The method of claim 11, wherein the operation of removing the silicide layer comprises removing the silicide layer on the ILD layer using a chemical mechanical polishing (CMP) process.

14. The method of claim 11, wherein the operation of forming the silicon layer comprises forming the silicon layer on the ILD layer and the epi-layer, and conformal to the contact opening using a chemical vapor deposition (CVD) process, a physical vapor deposition (PVD) process or a high density plasma (HDP) process.

15. The method of claim 9, further comprising forming a liner on the ILD layer and conformal to the contact opening.

16. The method of claim 15, wherein the operation of forming the silicide cap comprises:
   forming a silicon layer conformal to the liner and on the epi-layer;
   annealing the silicon layer to form a silicide cap on the epi-layer and a silicide layer on the liner; and
   removing the silicide layer and the liner above the ILD layer.

17. The method of claim 16, wherein the operation of forming the silicide cap comprises etching the silicide layer on the liner conformal to the contact opening.

18. The method of claim 16, wherein the operation of removing the silicide layer and the liner comprises removing the silicide layer and the liner above the ILD layer using a CMP process.

19. The method of claim 16, wherein the operation of forming the silicon layer comprises forming the silicon layer conformal to the liner and on the epi-layer using a CVD process, a PVD process or a HDP process.

* * * * *